May 27, 1969 A. C. LEENHOUTS 3,445,921

METHOD OF MAKING A PRINTED CIRCUIT BOARD MASTER

Filed Dec. 15, 1966

INVENTOR
Albert C. Leenhouts
BY
Johnson and Kline
ATTORNEYS

United States Patent Office 3,445,921

Patented May 27, 1969

3,445,921

METHOD OF MAKING A PRINTED CIRCUIT BOARD MASTER

Albert C. Leenhouts, Granby, Conn., assignor to The Superior Electric Company, Bristol, Conn., a corporation of Connecticut Filed Dec. 15, 1966, Ser. No. 602,012
Int. Cl. B23p 3/00; B41m 3/08; H05k 3/20
U.S. Cl. 29—527.2 11 Claims

ABSTRACT OF THE DISCLOSURE

A master for making printed circuits is made by forming the desired pattern in one surface of a light pervious body by machining grooves, the width of which correspond to the desired pattern width, and rendering the remainder of the body opaque to light.

The present invention relates to a master from which printed circuit boards may be subsequently prepared to correspond to the master and to the method of making the master and its use.

As presently constructed, printed circuit boards consist of a rigid sheet of insulating material having lines of electrical conducting material bonded or otherwise secured to one or both faces. The board has apertures into which support leads of various electrical components are inserted and then clinched to lock the components to the board. The leads generally constitute the electrical connectors to the components and the conducting lines connect the leads together as the electrical circuitry requires.

In the printed circuit board, the amount of current that a conducting line carries is usually determinative of an increase in width of the conducting line above a common minimum width. The edges of the lines are required to be minimally spaced from each other to prevent unwanted electrical interaction and should be carefully formed about each aperture in order to assure that the lead that is to be inserted in the aperture will be connected to the conducting line.

The conventional method of making a printed circuit board has heretofore involved the making by a skilled operator of an enlarged drawing of the board with the conducting lines accurately drawn and the drawing is subsequently photographically reduced in size to a photographic negative that is of the actual size of the board. The negative is employed as a master to form silk screen images that are used in the manufacture of the board. While this method has produced printed circuit boards, it is not completely satisfactory for many reasons including that it is relatively expensive because of the time required of a skilled technician; it tends to be too imprecise for many applications by reason of factors such as drawing paper dimensional instability; and it requires substantial drawing and photographic equipment for the manufacture of precise boards.

It is accordingly an object of the present invention to provide an inexpensive and quick method of making a printed circuit board master from which printed circuit boards may be duplicated in subsequent manufacturing processes.

Another object of the present invention is to provide a printed circuit board master in which dimensions of the parts may be accurately controlled within small tolerances and be dimensionally stable.

A further object of the present invention is to provide a method for making a printed circuit board master and the master made thereby in which the width of conducting lines may be easily and effectively varied and in which the terminal portions thereof that contact the leads of components secured to the board are accurately positioned.

In carrying out the present invention, the master is formed directly on a plate of material having translucent and/or transparent properties so as to be able to transmit light therethrough. The plate is flat and relatively thick and one piece of material that has been found acceptable is a clear plastic material such as Plexiglas that has a flat face at least of the size equal to the size of the printed circuit board to be formed therefrom. The flat face of the plate in one embodiment has an opaque coating bonded thereto which renders the plate opaque to light from the one face to the other. The opaque coating may for example be merely a coat of black paint.

The plate is then mounted in a cutting machine which is capable of moving the plate in a plane on both the X and Y axes with respect to a cutting tool. The plate and/or the tool are also mounted for relative perpendicular movement (Z axis) so that the depth of penetration of the tool into the plate may be controlled. The plate and cutting tool are moved with respect to each other such as to inscribe through the opaque coating grooves which correspond to the desired conducting lines in the final printed circuit board. The cutting tool is preferably formed in a conical shape and by regulating the depth of penetration into the plate, the width of the conducting lines may be adjusted. Thus the cutting tool cuts into the plate grooves which are angular, circles which are conical and the width of the grooves and the circles at the face having the opaque coating correspond to the desired width of the conducting lines and diameters of the lead pads in the final printed circuit board.

More particularly, the cutting is achieved automatically by the use of numerically coded information bearing material such as punched tape, which controls the relative movement of the plate and cutting tool both along the XY axis and also on the X axis. The grooves formed in such a manner are either straight or have straight segments, with curvilinear portions. They thus, extend along the X or the Y axis of the board with, wherever needed, a straight angular extent, such as one of 45 degrees to the two axes. The termination of some of the lines may be a conical indentation formed by the same cutting tool in order to provide a lead contacting pad wherever called for in the printed circuit board. One example of a machine tool drive which as been found exceedingly advantageous is marketed by the assignee of the present invention and is known as a "Slo-Syn" numerical control system.

A master formed as above disclosed constitutes a positive image of the printed circuit board from which a negative image may be made simply and easily by placing the photographic film on which the image is to be formed against the opaque surface and transmitting light from one face through the other of the master. The negative photographic image may then be employed to make silk screen positives. If desired, in another embodiment, as hereinafter disclosed, the master may be made as negative image with light being transmitted through the plate wherever a conducting groove or pad is not present.

Other features and advantages will hereinafter appear.

Figure 1:
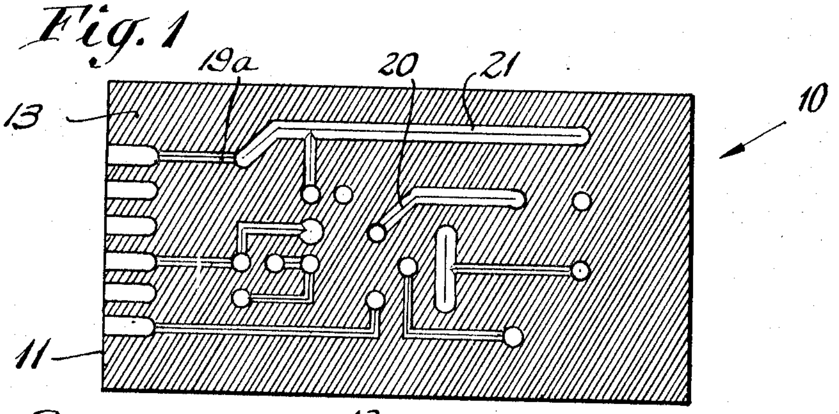
FIGURE 1 is a plan view of one embodiment of the printed circuit board master.
Figure 2:
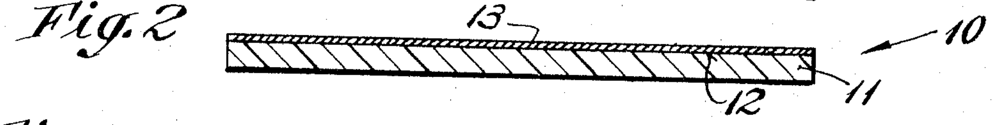
FIG. 2 is a side view of a plate from which the master is made.

Referring to the drawing, the embodiment of the master in FIGS. 1–6 is generally indicated by the reference numeral 10 and is formed from a plate 11 of light transmitting material, such as Plexiglas that also has dimensional stability. The plate 11 is rigid and relatively thick, i.e., on the order of a quarter of an inch, and has a size which includes an area that is at least as large as necessary to contain all the desired conducting lines formed on the final printed circuit board. The plate 11 has a face 12 on which an opaque coating 13 is secured. Such a coating may be, as heretofore mentioned, merely a thin layer of black paint which adheres to the face 12 and is thick enough to prevent light transmitted through the plate 11.

The plate 11 having the coating 13 is positioned on a working table 14 of a machine tool 14 having a Y axis drive 15, an X axis drive 16 and a Z axis drive 17. The machine further includes a rotating cutting tool 18 which if the table 14 is axially movable relative thereto is fixed in position and the depth of penetration of the tool 18 is controlled by the Z axis drive 17. The axis drives 15, 16 and 17 are controlled in accordance with the present invention by a numerical control system in which the extent of movement of the X, Y and Z axes drives are programed on an information bearing media, such as a punched tape. The information includes directions of movement and its extent along the X axis and Y axis individually and independently of each other and also the simultaneous movement of both axes at the same time to provide a 45 degree angular relative movement between the tool 18 and the plate 11. The Z axis may according to the program on the tape have the cutting tool 18 be free from the plate 11 or to penetrate it to a depth selected by the Z axis drive information.

Figures 3, 3A, 4, 4A, 5, 5A:
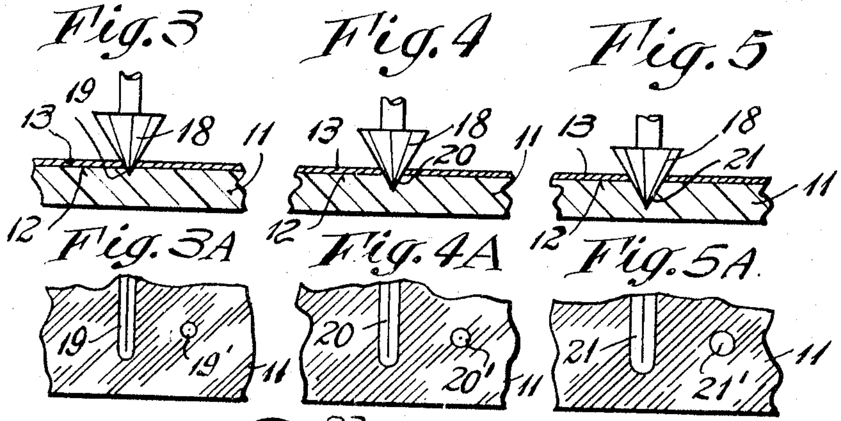
FIGS. 3, 4 and 5 are enlarged details showing the relative relationship between the plate and a cutting tool for various width lines.
FIGS. 3A, 4A and 5A are details showing a plan view of the various width lines and circular pads made by the relative positions of the plate and cutting tool shown in FIGS. 3, 4, and 5 respectively.

Referring to FIGS. 3, 4 and 5, the plate 11 is positioned on the machine 14 so that the opaque surface 13 is opposite the cutting tool 18 and so that any engagement by the cutting tool with the plate 11 will cut or otherwise initially remove the opaque coating 13. The cutting tool 18 is specifically shown as being conical in shape and formed with cutting edges on its exterior periphery though it will be understood that the shape of the tool need not be conical so long as it has upwardly diverging cutting edges. FIG. 3 discloses a groove 19 which is of a minimal width and thus cutting tool 18 penetrates the plate 11 for a depth necessary to have the width of the cutting tool at the face 12 be of the desired width of the cutting groove 19. With the tool 18 in this position, movements along the X and Y or both may be made to form a groove, such as the line 19*a* in FIG. 1 in which the groove removes the coating 13 for a constant width throughout its length and with the sides of the grooves being outwardly diverging as determined by the shape of the cutting tool. FIG. 4 depicts a groove 20 having a larger width than the groove 19 caused by a deeper penetration of the cutting tool 18 into the plate 11. FIG. 5 shows an even further penetration of the cutting tool into the plate 11 and a correspondingly larger width groove 21. Typical grooves 20 and 21 are indicated in FIG. 1.

The control of the depth of the cutting tool 18 can also be utilized to control the diameter of circular pads that are formed on the printed circuit board to contact the leads of various components which may be supported on the board. A small diameter pad 19′ only requires slight penetration of the tool 18 into the plate 11 or if it penetrates more, a larger pad 20′ will be formed and for an even greater penetration, an even pad 21′ will be formed.

While the pads 19′, 20′ and 21′ are shown as being individual they may of course be connected to a groove 19–21 simply by stopping X and Y movement of the table 14 at the desired position and then actuating the Z axis to provide the desired depth of penetration. As is generally the case, the pads are larger than the grooves and located at the ends of the grooves so that the tool is positioned at the beginning of a groove, penetrated to the depth required to form the required diameter pad, elevated to the groove width, moved on the X and Y axes to form the groove and then penetrated to form the terminal pad of the desired diameter. Thus the same cutting tool may be used to form lines of different width and pads of different diameter simply by the control of the depth of penetration of the cutting tool into the plate 11.

Figures 6, 7, 8, 9:
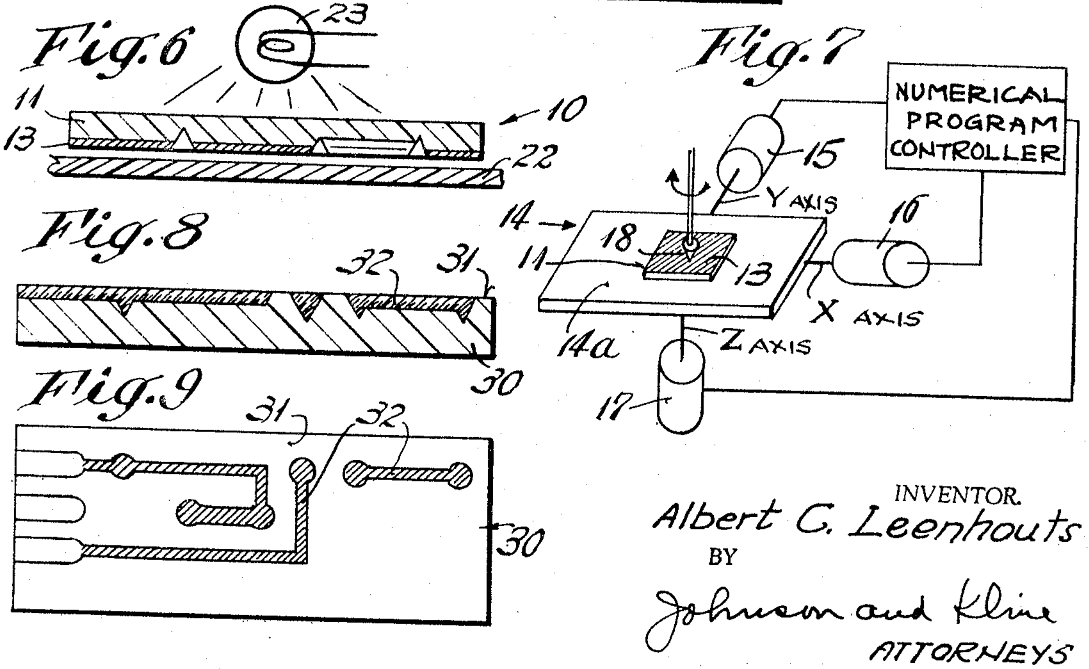
FIG. 6 is a sketch showing the use of the master to form a negative photographic image.
FIG. 7 is a diagrammatic illustration of a machine for making the various cuts in the master.
FIG. 8 is a sectional view of a further embodiment of a printed circuit board master wherein the master is a negative image of the desired printed circuit board.
FIG. 9 is a plan view thereof.

After the grooves and pads have been cut through the opaque layer 13, the master 10 is then utilized to form a photographic negative image. As shown in FIG. 6, the master 10 is placed against an unexposed photographic film 22 and a light 23 which may be luminous or infrared but in any event is capable when energized to cause the photographic film 22 to react. The rays from the light 23 cause a contact print to be made of any portion of the master 10 in which the opaque layer 13 has been removed. The negative image, by being a contact print, will have its image exceedingly precise with respect to the master and hence preciseness in duplication is achieved. The photographic film negative may then be utilized to form silk screens having the desired image with the screens being used to make printed circuit boards in the usual manner.

While the heretofore disclosed embodiment of the invention has utilized an opaque layer 13 to form a positive image of the circuit board, it will be appreciated that a negative image may be obtained as shown in the embodiment of FIGS. 8 and 9. A plate 30 of the same material as the plate 11 is provided except however it fails to have an opaque coating 13. The face 31 has formed therein the grooves and pads corresponding to the desired printed circuit board conducting lines and pads. An opaque material 32 is then positioned within the grooves to render the cut portions of the plate non-transparent. The opaque material 32 may be merely just a coating on the sides of the various grooves and pads or it may be a solid material that fills the grooves and pads to a position flush with the surface 31. As the plate 30 is thus light pervious in all areas except where it has the opaque material 32, a positive silk screen image may thus be made therefrom.

In the making of the information bearing media for controlling the X, Y and Z axes, an engineering sketch is made of the desired groove and pad locations and dimensions and from the sketch a relatively unskilled operator may easily prepare the information media. If desired, the pad locations may be made on one punched tape and the grooves on another instead of on only one tape. Moreover, in such an instance the punched tape for the pads may be used as the program instructions for drilling the holes in the actual printed circuit board for receiving the leads of the various components.

It will accordingly be appreciated that there has been disclosed a method of making a master for use in subsequent operations to make printed circuit boards and the master produced by the article. The master has grooves formed therein which have a width on a face that corresponds to extent, direction and width of the conducting lines in the printed circuit board. Also, the master has on the face, circular pads which correspond to pads that are to appear in the printed circuit board. The master is dimensionally stable, capable of repeated use and is quickly and economically made by the use of a numerically controlled machine in which the required preciseness of the grooves and pads is automatically obtained. Moreover, by the present invention, the grooves are formed to be either a straight line or be composed of straight segments without curvilinear portions.

Variations and modifications may be made within the scope of the claims and portions of the improvements may be used without others.

I claim:

1. The method of making a printed circuit board master for use in the manufacture of a printed circuit board having conducting lines comprising the steps of providing a plate of substantially rigid, light pervious material having at least one flat face, placing said flat face against a cutter having diverging cutting surfaces and relatively moving them to form an angular groove in said flat face wherever a conducting line is desired on the printed circuit board, regulating the depth of penetration of the cutter into the plate to control the width of the groove and causing the remainder of the plate to be oppositely light conductive with respect to said groove.

2. The invenion as defined in claim 1 in which the last-named step includes the step of causing the groove to be opaque and the remainder of the plate to remain light pervious.

3. The invention as defined in claim 1 in which the last-named step includes the step of forming a thin opaque layer on the one face prior to forming a groove and in which the step of cutting each groove cuts the opaque layer.

4. The invention as defined in claim 1 in which the cutter and the plate are moved in straight lines relative to each other to form straight line grooves to have the conducting lines in the printed circuit board be linear.

5. The invention as defined in claim 4 in which the step of cutting a groove includes the step of increasing the penetration of the cutter into the plate at the termination of a groove to form a circular pad having a diameter larger than the width of the groove.

6. The invention as defined in claim 1 in which the process of manufacturing a printed circuit board includes the forming of a photographic image and in which the image is formed by placing light sensitive paper in contact with the one face and passing light through the plate.

7. The method of making a printed circuit board master for use in the manufacture of a printed circuit board having conducting lines comprising the steps of providing a plate of substantially rigid, light pervious material having at least one flat face, placing said flat face against a cutter having cutting surfaces and relatively moving them to form a groove in said flat face wherever a conducting line is desired on the printed circuit board with said cutter cutting into the flat face of the plate to form the groove and causing the remainder of the plate to be oppositely light conductive with respect to said groove.

8. The method of making a master having accurately formed and precisely positioned line and pad portions for subsequent use in making printed circuit boards comprising the steps of providing an image-free plate on which the image is to be formed to make the master, rendering an image forming member operable to effect formation of a small selected area of the total image and simultaneously relatively moving the plate and the image forming member to form a line portion of the image having a thickness corresponding to the width of the area, rendering the image forming member ineffective to form an image and simultaneously relatively moving the plate and the image forming member to position another portion of the plate in alignment therewith, and rendering the image forming member operable to effect formation of a small selected area of the total image and simultaneously relatively moving the plate and the image forming member to form another line portion of the image having a thickness corresponding to the width of the area whereby two unconnected line portions of the image are formed in the master.

9. The invention as defined in claim 8 in which there is the step of positioning the plate with respect to the image forming member while the latter is rendered ineffective to form an image and maintaining stationary the plate and image forming member while rendering the image forming member effective and then non-effective to form an image of the member whereby a pad is formed.

10. The invention as defined in claim 8 in which the steps of relatively moving the plate include moving it for extents and directions which exactly correspond with the extents and directions of each line portion of the image whereby the master is made the same size as the printed circuit board made therefrom.

11. The invention as defined in claim 8 in which the steps of making the master include the step of making a program of the steps to be effected and subsequently carrying out the steps whereby the image may be automatically formed.

References Cited

UNITED STATES PATENTS

| | | | |
|---|---|---|---|
| 1,857,929 | 5/1932 | McFarland. | |
| 2,506,166 | 5/1950 | Olson. | |
| 2,600,343 | 6/1952 | Tuttle. | |
| 2,662,957 | 12/1953 | Eisler. | |
| 3,004,469 | 10/1961 | Broyer. | |
| 3,022,570 | 2/1962 | Taylor | 29—621 |
| 3,313,223 | 4/1967 | Frantzen | 95—1 |
| 3,369,293 | 2/1968 | Tillotson | 29—625 |

JOHN F. CAMPBELL, *Primary Examiner.*

P. M. COHEN, *Assistant Examiner.*

U.S. Cl. X.R.

29—460, 625; 95—1, 73; 117—5.5